US012795961B2

(12) United States Patent
Wyckoff et al.

(10) Patent No.: US 12,795,961 B2
(45) Date of Patent: Nov. 10, 2026

(54) CAPACITOR STRUCTURE INTEGRATED WITH CONTACT PAD STRUCTURE

(71) Applicant: BAE SYSTEMS Information and Electronic Systems Integration Inc., Nashua, NH (US)

(72) Inventors: Nathaniel P. Wyckoff, Marion, IA (US); Jacob R. Mauermann, Marion, IA (US); Alexander S. Warren, North Liberty, IA (US); William J. Klema, Marion, IA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 462 days.

(21) Appl. No.: 18/342,963

(22) Filed: Jun. 28, 2023

(65) Prior Publication Data

US 2025/0006779 A1 Jan. 2, 2025

(51) Int. Cl.
*H10D 1/68* (2025.01)
*H01G 4/012* (2006.01)
(Continued)

(52) U.S. Cl.
CPC ............. *H10D 1/692* (2025.01); *H01G 4/012* (2013.01); *H01G 4/33* (2013.01); *H10D 1/694* (2025.01);
(Continued)

(58) Field of Classification Search
CPC .......... H01G 4/012; H01G 4/228; H01G 4/33; H01L 23/49822; H01L 23/49827
See application file for complete search history.

(56) References Cited

U.S. PATENT DOCUMENTS

| | | | |
|---|---|---|---|
| 5,912,507 A | 6/1999 | Dunn et al. | |
| 6,108,212 A | 8/2000 | Lach et al. | |

(Continued)

FOREIGN PATENT DOCUMENTS

| | | | |
|---|---|---|---|
| JP | 3856304 B2 | 12/2006 | |
| WO | 03/017367 A1 | 2/2003 | |
| WO | 2016/187593 A1 | 11/2016 | |

OTHER PUBLICATIONS

International Search Report, PCT/US24/31602, mailed Oct. 4, 2024, 10 pages.

(Continued)

*Primary Examiner* — Nathan Milakovich
(74) *Attorney, Agent, or Firm* — Gary McFaline

(57) ABSTRACT

Integrated capacitor structures are described. In an example, an interconnect structure includes a first layer of conductive material and a second layer of conductive material. The first layer includes a first horizontal portion having a first opening and extending along a first horizontal plane, and a first vertical portion. The second layer includes a second horizontal portion having a second opening and extending along a second horizontal plane, and a second vertical portion. The interconnect structure also includes a dielectric extending along a third horizontal plane between the first and second horizontal portions, and having one or more openings. The first vertical component extends upward from the first horizontal portion, through one opening in the dielectric and the second opening of second layer, and the second vertical component extends downward from the second horizontal portion, through another opening in the dielectric and the first opening of first layer.

19 Claims, 9 Drawing Sheets

(51) Int. Cl.

| | |
|---|---|
| ***H01G 4/228*** | (2006.01) |
| ***H01G 4/33*** | (2006.01) |
| ***H10W 70/65*** | (2026.01) |
| ***H10W 72/20*** | (2026.01) |
| ***H10W 72/90*** | (2026.01) |
| ***H10W 90/00*** | (2026.01) |

(52) U.S. Cl.

CPC ............ *H10W 70/65* (2026.01); *H01G 4/228* (2013.01); *H10W 72/221* (2026.01); *H10W 72/922* (2026.01); *H10W 72/926* (2026.01); *H10W 72/931* (2026.01); *H10W 72/936* (2026.01); *H10W 72/9415* (2026.01); *H10W 72/9445* (2026.01); *H10W 72/952* (2026.01); *H10W 90/701* (2026.01); *H10W 90/724* (2026.01); *H10W 90/754* (2026.01)

(56) References Cited

U.S. PATENT DOCUMENTS

| | | | |
|---|---|---|---|
| 6,809,020 | B2 | 10/2004 | Sakurai et al. |
| 6,927,471 | B2 | 8/2005 | Slamon |
| 7,564,131 | B2 | 7/2009 | Ryu et al. |
| 7,572,725 | B2 | 8/2009 | Storli |
| 7,670,876 | B2 | 3/2010 | Tsai |
| 8,344,522 | B2 | 1/2013 | Mizuhara et al. |
| 8,409,704 | B2 * | 4/2013 | Fukuhara .................. B32B 5/24 428/209 |
| 9,000,587 | B1 | 4/2015 | Kelkar et al. |
| 9,530,719 | B2 | 12/2016 | Shen |
| 9,543,263 | B2 | 1/2017 | Shih et al. |
| 10,727,174 | B2 | 7/2020 | Belonio, Jr. et al. |
| 11,101,235 | B2 | 8/2021 | Chen |
| 2003/0127747 | A1 | 7/2003 | Kajiwara et al. |
| 2006/0231927 | A1 | 10/2006 | Ohno |
| 2007/0182004 | A1 | 8/2007 | Rinne |
| 2007/0210439 | A1 | 9/2007 | Kang et al. |
| 2008/0012128 | A1 | 1/2008 | Makino et al. |
| 2008/0203583 | A1 | 8/2008 | Jung et al. |
| 2010/0213602 | A1 | 8/2010 | Smeys et al. |
| 2011/0108950 | A1 | 5/2011 | Jou et al. |
| 2011/0278723 | A1 | 11/2011 | Nishimura et al. |
| 2014/0035129 | A1 | 2/2014 | Stuber et al. |
| 2015/0364411 | A1 | 12/2015 | Shen |
| 2018/0132355 | A1 * | 5/2018 | Saita ...................... H05K 1/115 |
| 2019/0069411 | A1 | 2/2019 | Park et al. |
| 2020/0066622 | A1 * | 2/2020 | Jain ................... H01L 23/49822 |
| 2020/0107449 | A1 * | 4/2020 | Fu ........................ H05K 3/0011 |
| 2020/0126934 | A1 * | 4/2020 | Oyamada ................ H01L 24/11 |
| 2020/0294908 | A1 | 9/2020 | Haba et al. |

OTHER PUBLICATIONS

International Search Report and Written Opinion received for PCT/US2024/031389. Mail date: Aug. 16, 2024. 10 pages.

U.S. Appl. No. 18/799,374, filed Aug. 9, 2024 29 pages (includes 21 pages of specification, claims and abstract of the disclosure, and 8 pages of figures).

U.S. Appl. No. 18/206,731, filed Jun. 7, 2023. 39 pages (includes 28 pages of specification, claims and abstract of the disclosure, and 11 pages of figures).

International Search Report, PCT/US25/40819, mailed Dec. 12, 2025, 27 pages.

* cited by examiner

CAPACITOR STRUCTURE INTEGRATED WITH CONTACT PAD STRUCTURE

TECHNICAL FIELD

The present disclosure relates generally to microelectronic devices, and more particularly to capacitors in microelectronic devices.

BACKGROUND

A capacitor is a passive electronic component that stores electrical energy in an electric field, by accumulating electric charges on two opposing electrodes separated by dielectric material. Capacitors are widely used in various types of circuits, and for a wide range of applications, such as filtering signals, storing energy, conditioning a power signal, many other applications.

Figure 1:
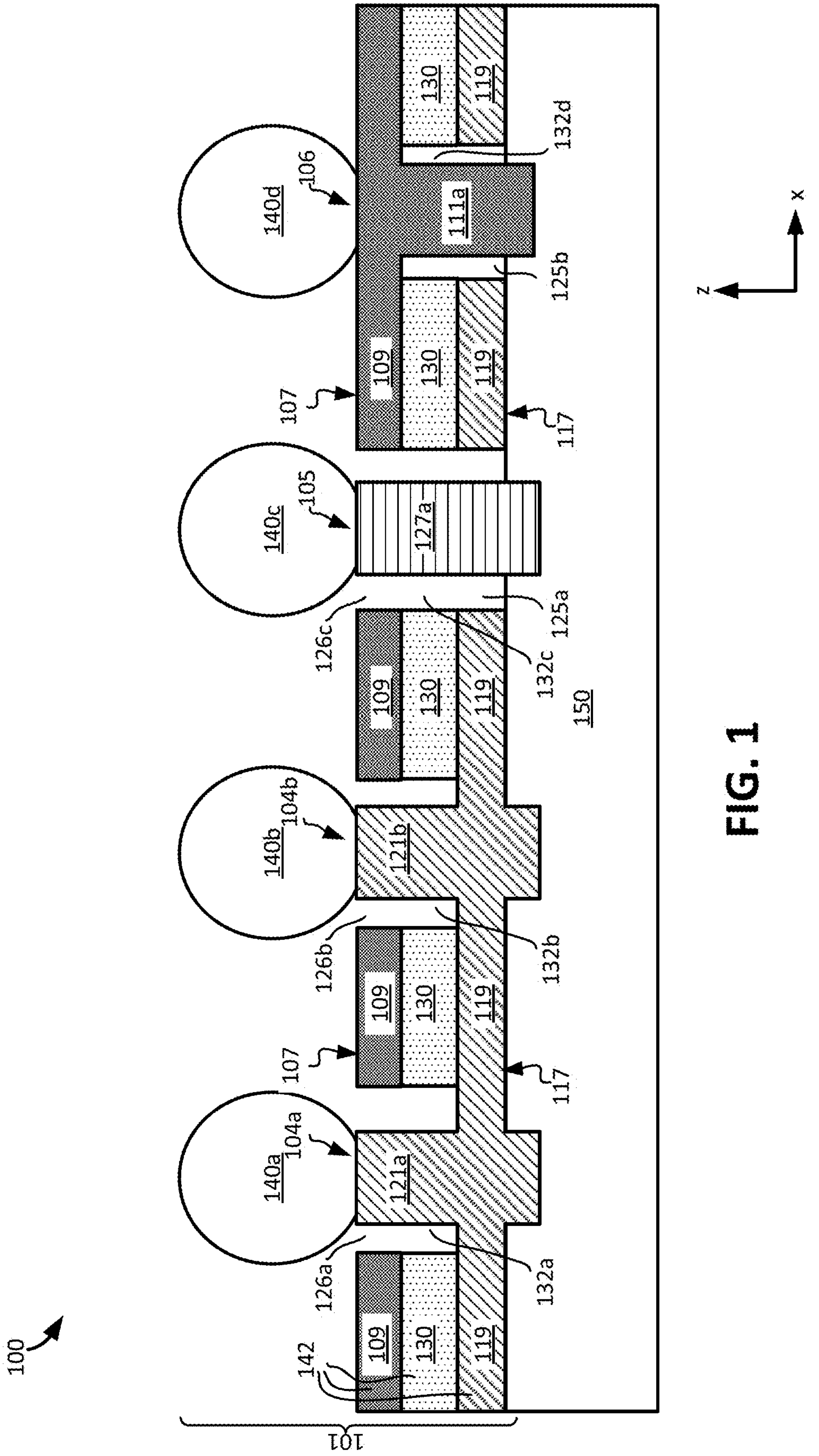
FIGS. 1 and 2 illustrate cross-sectional and exploded perspective views, respectively, of a microelectronic device structure, in which a capacitor is integrated with one or more contact pads of the microelectronic device structure, in accordance with an embodiment of the present disclosure.

The figures depict various embodiments of the present disclosure for purposes of illustration only and are not necessarily drawn to scale. Numerous variations, configurations, and other embodiments will be apparent from the following detailed discussion.

DETAILED DESCRIPTION

Disclosed herein are capacitor structures that are integrated with contact pad structures. For example, instead of using a separate surface mounted capacitor, the capacitor is integrated with two or more contact pads. Such an integrated capacitor structure may be formed at a die level, at a package level, or at a circuit board level.

In one embodiment, a microelectronic device comprises a first contact pad structure including conductive material, and a first horizontal portion of conductive material extending from the first contact pad structure along a first horizontal plane. The microelectronic device further comprises a second contact pad structure including conductive material, and a second horizontal portion of conductive material extending from the second contact pad structure along a second horizontal plane different from the first horizontal plane. A dielectric material is between the first horizontal plane and the second first horizontal plane (so as to also be between the first and second horizontal portions of conductive material). In an example, the dielectric material is a layer of dielectric material and has a thickness of at most 4000 nanometers (nm). More generally, the dielectric thickness (or distance between the first and second horizontal portions of conductive material) may be any distance suitable for providing a desired capacitance for a given application. In an example, at least a section of the first horizontal portion provides a first capacitor electrode, at least a section of the second horizontal portion provides a second capacitor electrode, and at least a section of the layer of dielectric material provides a capacitor dielectric, where the first capacitor electrode, the second capacitor electrode, and the capacitor dielectric provide a capacitor. Each of the first and second horizontal portions of conductive material may extend horizontally in a discontinuous fashion, such that there may be one or more openings in that horizontal portion.

In another embodiment, an interconnect structure comprises a first layer of conductive material comprising (i) a first vertical portion, and (ii) a first horizontal portion extending along a first horizontal plane, with a first opening within the first horizontal portion. The interconnect structure further comprises a second layer of conductive material comprising (i) a second vertical portion, and (ii) a second horizontal portion extending along a second horizontal plane, with a second opening within the second horizontal portion. A layer of dielectric material extends along a third horizontal plane between the first and second horizontal portions, and has third and fourth openings. In an example, the first vertical component extends upward from the first horizontal portion, through the third opening within the layer of dielectric material and through the second opening within the second horizontal portion. Also, in this example, the second vertical component extends downward from the second horizontal portion, through the fourth opening within the layer of dielectric material and through the first opening within the first horizontal portion. In such an example, at least a section of the first horizontal portion provides a first capacitor electrode, at least a section of the second horizontal portion provides a second capacitor electrode, and at least a section of the layer of dielectric material provides a capacitor dielectric, wherein the first capacitor electrode, the second capacitor electrode, and the capacitor dielectric provide a capacitor or an otherwise intentionally capacitive structure. In some such examples, a first interconnect component is coupled to an upper surface of the first vertical portion, and a second interconnect component is coupled to an upper surface of the second horizontal portion. The first and second interconnect components may be, for instance, a conductive bump such as a solder ball or other similar conductive interconnect feature (e.g., any bump-like feature of metal, alloy or other conductive material). In an example, the interconnect structure is included within one of a printed circuit or wiring board (PCB or PWB), an integrated circuit die, or a carrier substrate of an integrated circuit package.

In yet another embodiment, a capacitor structure comprises a first electrode, continuous and monolithic with, a first contact pad; a second electrode, continuous and monolithic with, a second contact pad; and a capacitor dielectric between the first electrode and the second electrode. In an example, the first contact pad comprises a vertical structure that extends through an opening within the second electrode, without making contact with the second electrode. Numerous variations and embodiments will be apparent in light of the present disclosure.

General Overview

As indicated above, capacitors may be mounted on a surface of a circuit board, or a surface of an integrated circuit package carrier substrate. However, such surface mount capacitors may consume a significant amount of space in a microelectronic device package or a circuit board, such as a printed wiring board (PWB), a printed circuit board (PCB), or a circuit card assembly (CCA).

Accordingly, techniques are described herein to form capacitors that are integrated with contact pad structures of a microelectronics device. For example, instead of using a separate surface mount capacitor, the capacitor is integrated with the contact pad structure itself, thereby saving area to implement the capacitor, as well as enhancing performance, as will be described below in detail.

In some examples, in an interconnect structure of a microelectronics device structure, a first contact pad may be implemented using a first layer of conductive material, and a second contact pad may be implemented using a second layer of conductive material. In some such examples, the first layer comprises (i) a first horizontal portion extending along a first horizontal plane, with a first plurality of openings within the first horizontal portion, and (ii) one or more first vertical portions. Similarly, the second layer comprises (i) a second horizontal portion extending along a second horizontal plane, with a second plurality of openings within the second horizontal portion, and (ii) one or more second vertical portions. A dielectric material extends along a third horizontal plane between the first and second horizontal planes, such that the dielectric material is between the first and second horizontal portions. For example, a layer of dielectric material is above the second horizontal portion, and the first horizontal portion is above the layer of dielectric material.

In one such embodiment, the layer of dielectric material has a third plurality of openings. Each of the third plurality of openings may be aligned with (e.g., above or below) one of the first plurality of openings of the first layer and/or one of the second plurality of openings of the second layer.

In one embodiment and as will be described in detail below, at least one of the first vertical portions of the first layer extends upward from the first horizontal portion, through an opening within the dielectric material and through an opening within the second horizontal portion (e.g., without contacting the second horizontal portion). Similarly, at least one of the second vertical portions of the second layer extends downward from the second horizontal portion, through another opening within the dielectric material and through an opening within the first horizontal portion (e.g., without contacting the first horizontal portion).

In one embodiment, a first contact pad is formed by at least a section of an upper surface of the at least one of the first vertical portions of the first layer. For example, an interconnect component (e.g., a conductive bump, such as a solder ball) is coupled to the first contact pad.

In one embodiment, a second contact pad is formed by at least a section of an upper surface of the second horizontal portion of the second layer. For example, another interconnect component (e.g., a conductive bump, such as a solder ball) is coupled to the second contact pad.

In one embodiment, at least a section of the first horizontal portion provides a first capacitor electrode, at least a section of the second horizontal portion provides a second capacitor electrode, and at least a section of the layer of dielectric material provides a capacitor dielectric, wherein the first capacitor electrode, the second capacitor electrode, and the capacitor dielectric provide a capacitor. Thus, the capacitor is formed using conductive electrodes that are lateral extensions (e.g., two horizontal portions of the two layers) of the two corresponding contact pads described above.

In one example, a third conductive layer may extend vertically through openings within the first horizontal portion, the second horizontal portion, and the layer of dielectric material, without contacting the first or second horizontal portions. In such an example, an upper surface of the third layer may form a third contact pad, and may be coupled to a third interconnect component (e.g., a conductive bump, such as a solder ball).

In an example, the first horizontal section of the first layer may be a first one of a power plane, a ground plane, or a signal plane. The second horizontal section of the second layer may be a second one of the power plane, the ground plane, or the signal plane. The third vertical layer may be a third one of the power plane, the ground plane, or the signal plane.

The capacitor that is formed using the horizontal portions of the first and second layers may be implemented at any level of an integrated circuit system. For example, the first and second layers (sections of which form the contact pads and the capacitor) can be on an integrated circuit die, e.g., to couple the die in a flip-chip configuration to a package carrier substrate through corresponding solder bumps. In another example, the first and second layers (sections of which form the contact pads and the capacitor) can be on the package carrier substrate, e.g., to couple the package carrier substrate through corresponding solder bumps to the die, or a PCB. In another example, the first and second layers (sections of which form the contact pads and the capacitor) can be on the package carrier substrate, e.g., to couple the package carrier substrate through corresponding solder balls to a circuit board such as a PCB. In yet another example, the first and second layers (sections of which form the contact pads and the capacitor) can be on the circuit board, e.g., to couple the circuit board through corresponding solder balls to the package carrier substrate. Thus, in an example, the integrated capacitor may be at a die level, at a package level, or a board level. In an example, a device (such as a die, a package carrier substrate, or a circuit board) includes the above described contact pads and the capacitor integrated therewith.

Thus, the above described capacitor utilizes the first and second layers coupled to the contact pads, and is integrated with these contact pads. The capacitor is formed without taking substantial space within the microelectronic device structure. For example, there may not be an area penalty in the X-Y plane due to the formation of the capacitor, as the first and second layers would be anyway formed for the contact pads. There may be an increase in the vertical height of the microelectronic device structure, due to formation of the capacitor, where such an increase in the height may be equal to a height or thickness of the layer of dielectric material, and a height or thickness of any of the first or second horizontal portions. However, such an increase in height may be negligible, e.g., due to a relatively small thickness (or vertical height) of the first and second horizontal portions and the dielectric material. For example, the layer of dielectric material may have a thickness (e.g., measured in the vertical or Z-axis direction) in the range of 100 nanometers (nm) to 4000 nm, and may depend on a desired dielectric constant of the capacitor dielectric material. For example, with aluminum nitride as the capacitor dielectric material (e.g., having a dielectric constant of about 8.5), a capacitor with about 75 pF/mm$^2$ may be achieved with a vertical thickness of about 1020 nm of the dielectric material. In an example, the vertical thickness of the first and/or second horizontal portions may be in the range of 10 nm to 500 nm.

In one embodiment, the capacitor integrated with the contact pads eliminates or at least reduces usage of surface or board mount capacitors, thereby saving area, cost, and/or performance of the microelectronic device structure. In an example where the capacitor is used for power conditioning, integrating the capacitor with the contact pads and having the capacitor proximal to the power and ground planes may reduce parasitic inductance, which increases effective capacitance at high frequencies, e.g., resulting in enhanced performance of high-speed integrated circuits.

In one embodiment, each of the first and second layers may be additively formed. For example, the first horizontal portion and the first vertical portions of the first layer may be formed during a same deposition process, and hence, the first layer may be continuous and monolithic, e.g., without any interface (e.g., a seam or a grain boundary) therebetween. Similarly, the second layer may also be continuous and monolithic. Further processes to form the first and second layers and the capacitor are described below, e.g., with respect to FIGS. 6-7D.

In accordance with some embodiments of the present disclosure, these various approaches can be used individually or together to design and form capacitors integrated with conductive contact pads. Numerous variations and embodiments will be apparent in light of the present disclosure.

As used herein, the term "about" indicates that the value listed may be somewhat altered or otherwise within an acceptable tolerance, as long as the alteration does not result in nonconformance of the process or device. For example, for some elements the term "about" can refer to a variation of +0.1%, for other elements, the term "about" can refer to a variation of ±1% or ±10%, or any point therein. As also used herein, terms defined in the singular are intended to include those terms defined in the plural and vice versa.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat.

Architecture

Figure 2:
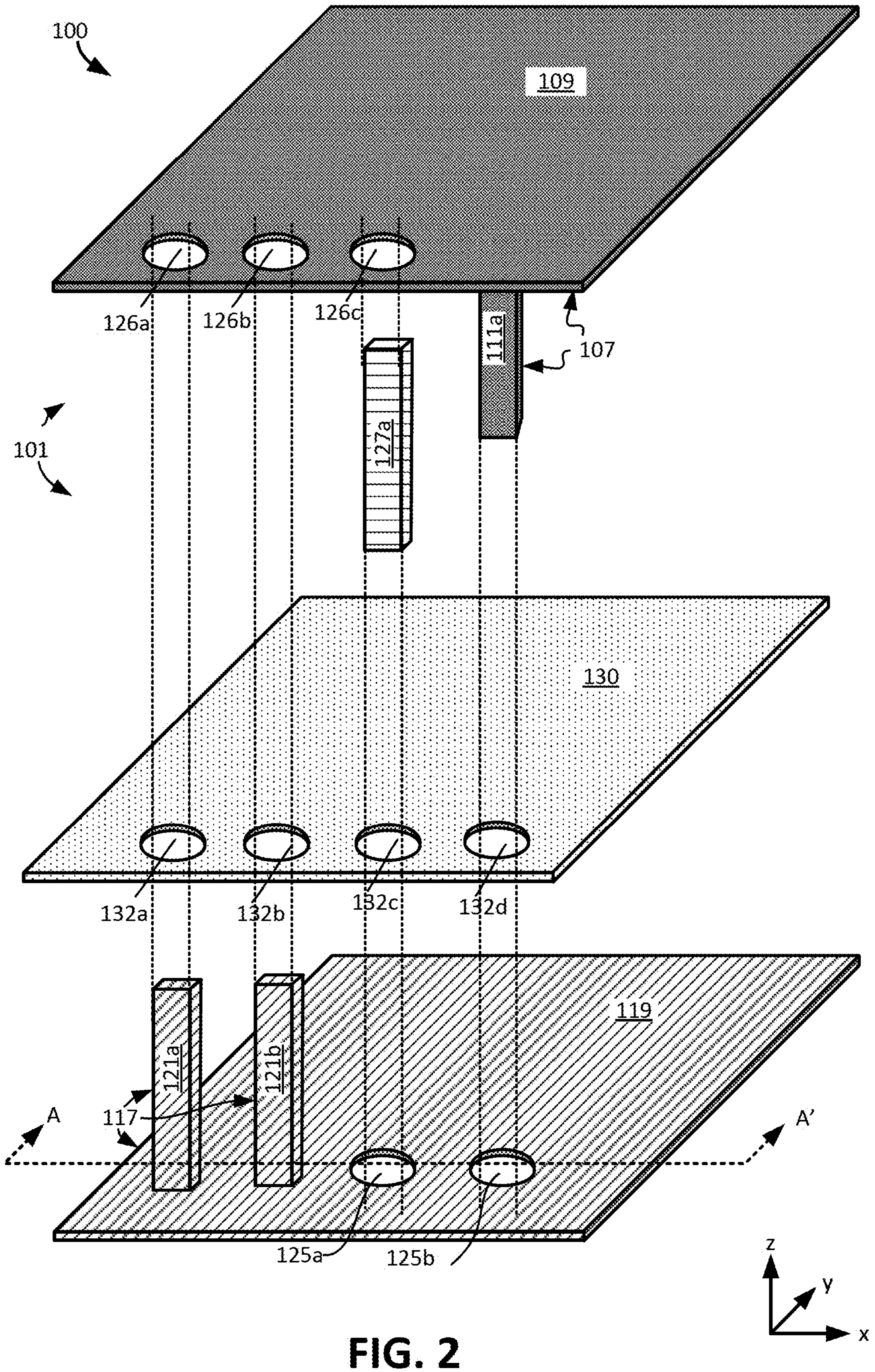

FIG. 1 illustrates a cross-sectional view and FIG. 2 illustrates an exploded view of a microelectronic device structure 100 (also referred to herein as structure 100), in which a capacitor 142 is integrated with one or more contact pads 104*a*, 104*b*, and 104*d* of the microelectronic device structure 100, in accordance with an embodiment of the present disclosure. The cross-sectional view of FIG. 1 may be along line A-A' of the exploded view of FIG. 2, such that the cross-sectional view of FIG. 1 illustrates cross-sections of openings 125*a*, 125*b*, and vertical portions 121*a*, 121*b* (and various other components) of FIG. 2.

As described below, in an example, the structure 100 comprises an interconnect structure 101 above a device 150, where the device 150 may be a printed circuit board (PCB), a printed wiring board (PWB), a package substrate, an integrated circuit die, or another appropriate integrated circuit device. Thus, the structure 100, including the interconnect structure 101, may be implemented at a board level, at a package level, or a die level of a microelectronic device system. Note that the device 150 is illustrated in FIG. 1, and not in FIG. 2. The example of FIG. 2 illustrates exploded view of the interconnect structure 101, without the device 150 below the interconnect structure 101.

Referring to FIGS. 1 and 2, in one embodiment, the interconnect structure 101 comprises a layer 107 of conductive material. In an example, the layer 107 comprises a horizontal portion 109 extending along a horizontal plane (e.g., along a plane defined by the X-Y axes), and one or more (such as a plurality of) vertical portions 111 extending vertically downward (e.g., along a Z-axis direction) from the horizontal portion 109. Note that in FIGS. 1 and 2 only one such vertical portion 111*a* is illustrated, although the layer 107 may comprise more than one such vertical portions.

In some examples, the horizontal portion 109 and the vertical portions 111 may form the continuous conductive material of the layer 107. In some such examples, the layer 107 may be monolithic. For example, there may not be an interface (such as seam or grain boundary) between the horizontal portion 109 and the vertical portions 111 of the layer 107; instead, they are part of the same continuous body of conductive material. For example, the layer 107, including the horizontal portion 109 and the vertical portions 111, may be formed using a same conductive material deposition process (e.g., formed using an additive deposition process), and hence, the layer 107 may be continuous and monolithic. However, in another example, the horizontal portion 109 and the vertical portions 111 may be formed by separate conductive material deposition process, and there may be an interface therebetween.

Note that the intersection between the horizontal portion 109 and the vertical portion 111*a* illustrated in FIGS. 1 and 2 may be considered to be part of the horizontal portion 109, to be part of the vertical portion 111*a*, or to be part of both the horizontal portion 109 and the vertical portion 111*a*, in an example.

In one embodiment, the layer 107 may comprise an appropriate conductive material, such as one or more metals and/or alloys thereof. For example, the layer 107 may comprise copper, aluminum, nickel, gold, silver, and/or another appropriate conductive material.

The layer 107 has a plurality of openings 126*a*, 126*b*, 126*c* therewithin. The openings 126 are within the horizontal portion 109 of the layer 107. Although three openings 126*a*, 126*b*, 126*c* of the layer 107 are illustrated in FIGS. 1-2, the layer 107 may include a greater number of such openings 126.

The interconnect structure 101 further comprises a layer 117 of conductive material. In an example, the layer 117 comprises a horizontal portion 119 extending along the horizontal plane (e.g., along the plane defined by the X-Y axes), and one or more (such as a plurality of) vertical portions 121 extending vertically upward (e.g., along the Z-axis direction) from the horizontal portion 119. Note that in FIGS. 1 and 2 two such vertical portions 121*a*, 121*b* are illustrated, although the layer 117 may comprise more than one such vertical portions.

Note that the intersection between the horizontal portion 119 and the vertical portion 121*a* illustrated in FIGS. 1 and 2 may be considered to be part of the horizontal portion 119, to be part of the vertical portion 121*a*, or to be part of both the horizontal portion 119 and the vertical portion 121*a*, in an example. Similar description applies for the intersection between the horizontal portion 119 and the vertical portion 121*b*.

In some examples, the horizontal portion 119 and the vertical portions 121 may form the continuous conductive material of the layer 117. In some such examples, the layer 117 may be monolithic. For example, there may not be an interface (such as seam or grain boundary) between the horizontal portion 119 and the vertical portions 121 of the layer 117; instead, they are part of the same continuous body of conductive material. For example, the layer 117, including the horizontal portion 119 and the vertical portions 121, may be formed using a same conductive material deposition process (e.g., formed using an additive deposition process), and hence, the layer 117 may be continuous and monolithic. However, in another example, the horizontal portion 119 and the vertical portions 121 may be formed by separate conductive material deposition process, and there may be an interface therebetween.

In one embodiment, the layer 117 may comprise an appropriate conductive material, such as one or more metals and/or alloys thereof. For example, the layer 117 may comprise copper, aluminum, nickel, gold, silver, and/or another appropriate conductive material.

In an example, the layers 107 and 117 may be compositionally the same, or different. In an example, the layers 107 and 117 may be elementally the same, or different.

The layer 117 has a plurality of openings 125*a*, 125*b* therewithin. The openings 125 are within the horizontal portion 119 of the layer 117. Although two openings 125*a*, 125*b* of the layer 117 are illustrated in FIGS. 1-2, the layer 117 may include a greater number of such openings 125, in an example.

As illustrated in FIGS. 1 and 2, the horizontal portion 109 of the layer 107 is above the horizontal portion 119 of the layer 117. For example, the horizontal portion 109 of the layer 107 and the horizontal portion 119 of the layer 117 are separated by a layer of dielectric material 130.

The dielectric material 130 may be any appropriate dielectric material, such as one or more appropriate oxides, nitrides, carbides, oxynitrides, oxycarbides, and/or oxycarbonitrides. Examples of the dielectric material 130 include aluminum oxide ($Al_2O_3$), aluminum nitride (AlN), silicon oxide ($SiO_2$), tungsten trioxide ($WO_3$), titanium dioxide ($TiO_2$), and/or another appropriate dielectric material. In an example and as described below, the dielectric material 130 forms a dielectric material of a capacitor, and a choice of the dielectric material 130 may be based on a desired dielectric constant of the dielectric material 130.

In one embodiment, the dielectric material 130 also has a plurality of openings 132*a*, 132*b*, 132*c*, 132*d*. Although four openings 132 are illustrated within the dielectric material 130, the dielectric material 130 may include a greater number of openings, in an example.

In one embodiment, each opening 132 of the dielectric material 130 is at least in part aligned with one or more other openings of the layers 107 and/or 117. For example, as illustrated in FIG. 1, the opening 132*a* of the dielectric material 130 is at least in part aligned with the opening 126*a* of the layer 107 (e.g., the opening 132*a* is below the opening 126*a*). Similarly, the opening 132*b* of the dielectric material 130 is at least in part aligned with the opening 126*b* of the layer 107 (e.g., the opening 132*b* is below the opening 126*b*). Similarly, the opening 132*c* of the dielectric material 130 is at least in part aligned with the opening 126*c* of the layer 107 and the opening 125*a* of the layer 117 (e.g., the opening 132*c* is vertically between the openings 126*c* and 125*a*). Similarly, the opening 132*d* of the dielectric material 130 is at least in part aligned with the opening 125*b* of the layer 117 (e.g., the opening 132*d* is above the opening 125*b*).

In one embodiment, each of the vertical portions 111 and 121 of the layers 107, 117, respectively, extends through one or more of the above described openings. For example, as illustrated in FIGS. 1 and 2, the vertical portion 121*a* of the layer 117 extends through the opening 132*a* of the dielectric material 130 and the opening 126*a* of the layer 107. Similarly, the vertical portion 121*b* of the layer 117 extends through the opening 132*b* of the dielectric material 130 and the opening 126*b* of the layer 107. Similarly, the vertical portion 111*a* of the layer 107 extends through the opening 132*d* of the dielectric material 130 and the opening 125*b* of the layer 117.

In one embodiment, the interconnect structure 101 also comprises a plurality of layers or vertical components 127 extending through openings of the dielectric material 130 and the layers 107, 117, although only one such example vertical component 127*a* is illustrated in FIGS. 1 and 2. For example, the vertical component 127*a* extends through the opening 126*c* of the layer 107, the opening 132*c* of the dielectric material 130, and the opening 125*a* of the layer 117. The vertical layers 127 comprise conductive material, which may be similar to, or different from, the conductive materials of the layers 107, 117.

In one embodiment, the interconnect structure 101 comprises a plurality of interconnect components 140*a*, 140*b*, 140*c*, 140*d*. The interconnect components 140*a*, 140*b*, 140*c*, 140*d* may be, for example, solder balls, solder bumps, or other appropriate interconnect components. In one embodiment, the interconnect components 140*a*, 140*b*, 140*c*, 140*d* couple the device 150 to a circuit outside the structure 100, where the outside circuit can be a printed circuit board (PCB), printed wiring board (PWB), a package substrate, or an integrated circuit die, for example.

In one embodiment, the layers 107, 117, 127 of the interconnect structure 101 are formed on the device 150 of the structure 100. The device 150 may comprise a PCB, PWB, a package substrate, or an integrated circuit die, for example, depending on whether the interconnect structure 101 is implemented at a die level, or a package level, or a board level, as described below (e.g., see FIGS. 5A and 5B described below). In an example, the device 150 comprises a plurality of routing features coupled to the various layers 107, 117, 127, e.g., to route power, signals, ground to and/or from the various layers 107, 117, 127.

In one embodiment, as labelled in FIG. 1, a contact pad 104*a* comprises the vertical portion 121*a* (or at least a section of an upper surface of the vertical portion 121*a*), where the interconnect component 140*a* is on the contact pad 104*a*. Similarly, a contact pad 104*b* comprises the vertical portion 121*b* (or at least a section of an upper surface of the vertical portion 121*b*), where the interconnect component 140*b* is on the contact pad 104*b*. Similarly, a contact pad 105 comprises the vertical layer 127*a* (or at least a section of an upper surface of the vertical layer 127*a*), where the interconnect component 140*c* is on the contact pad 105.

Similarly, a contact pad 106 comprises at least a section of the upper surface of the horizontal portion 109 of the layer 107 (or at least a section of an upper surface of the vertical portion 111*a*, e.g., depending on whether the intersection between the horizontal portion 109 and the vertical portion 111*a* is considered to be a part of the horizontal portion 109 or the vertical portion 111*a*, as described above). The interconnect component 140*d* is on the contact pad 106.

Thus, the horizontal portion 119 of the layer 117 extends laterally from the contact pads 104*a*, 104*b*. Similarly, the horizontal portion 109 of the layer 107 extends laterally from the contact pad 104*d*. As described above, the horizontal portion 109 is above the horizontal portion 119, and separated from the horizontal portion 119 by the dielectric material 130.

In one embodiment, at least a section of the horizontal portion 109 comprises a first electrode of a capacitor 142, at least a section of the horizontal portion 119 comprises a second electrode of the capacitor 142, and the dielectric material 130 comprises a capacitor dielectric, as labelled in FIG. 1. Thus, the horizontal portions 109, 119, and the dielectric material 130 form the capacitor 142.

The capacitor 142 utilizes the layers 107, 119 coupled to the contact pads 104*a*, 104*b*, 106, and is integrated with these contact pads. Thus, the capacitor 142 is formed without taking substantial space within the structure 100. For example, there may not be an area penalty in the X-Y plane due to the formation of the capacitor 142, as the layers 107, 117 would be anyway formed for the contact pads 104, 105, 106. There may be an increase in the vertical height of the structure 100 due to formation of the capacitor 142, where such an increase in the height may be equal to a height of the dielectric material 130 and a height of any of the horizontal portions 109 or 119. However, such an increase in height may be negligible, e.g., due to a relatively small thickness (or vertical height) of the horizontal portions 109 or 119 and the dielectric material 130.

The capacitor 142 integrated with the contact pads 104*a*, 104*b*, 106 eliminates or at least reduces usage of surface or board mount capacitors, thereby saving area, cost, and/or performance of the structure 100. In an example where the capacitor 142 is used for power conditioning, locating the capacitor 142 on the interconnect structure 101 reduces parasitic inductance, which increases effective capacitance at high frequencies, e.g., resulting in enhanced performance of high-speed integrated circuits.

In one embodiment, the dielectric material 130 may have a thickness (e.g., measured in the vertical or Z-axis direction) in the range of 100 nanometers (nm) to 4000 nm, and may depend on a desired dielectric constant of the capacitor dielectric material. For example, with aluminum nitride as the capacitor dielectric material 130 (e.g., having a dielectric constant of about 8.5), a capacitor with about 75 $pF/mm^2$ may be achieved with a vertical thickness of about 1020 nm of the dielectric material 130.

In one embodiment, the layers 107, 117, 127 may be used to transmit power, ground, and/or signals. In an example, the layer 117 may be used to transmit power, the layer 107 may be used for grounding, and the layer 127*a* may be used to transmit signals. In another example, the layer 117 may be used for grounding, the layer 107 may be used to transmit power, and the layer 127*a* may be used to transmit signals. Other combinations may also be possible. In an example where the layer 127*a* is used to transmit signals, signal transmission is unaffected by the capacitor 142 formed between the ground plane and the power plane.

In an example, there may be multiple interconnect components 140 for the ground connection, and multiple interconnect components 140 for the power connection. Accordingly, the layer 117 may have more than one vertical portions (such as vertical portions 121*a*, 121*b*) to receive the interconnect components 140*a*, 140*b*. Similarly, the layer 107 may have more than one vertical portions (although only one vertical portion 111*a* is illustrated in FIGS. 1 and 2) to receive the interconnect components 140*d*. Thus, the horizontal portion 109 may be one of a power plane or a ground plane of the structure 100, and the horizontal portion 119 may be the other of the power plane or the ground plane of the structure 100.

In FIGS. 1 and 2, each of the horizontal portions 109 and 119 form a continuous plate or electrode for a single capacitor 142 (see perspective view of FIG. 2), where one or more vertical portions 121*a* and 121*b* of the layer 117 are electrically shorted by the horizontal portion 119, and where one or more vertical portions 111*a* and 111*b* (where 111*b* is not illustrated in FIGS. 1 and 2) of the layer 107 are electrically shorted by the horizontal portion 109. Thus, for example, where the layer 107 is a ground plane (or a power plane), multiple interconnect components may be coupled to the ground plane (or power plane). Similarly, where the layer 117 is a power plane (or a ground plane), multiple interconnect components may be coupled to the power plane (or ground plane).

In one embodiment, multiple such capacitors may be formed and integrated with the contact pads of the structure 100. For example, FIG. 3 illustrates an exploded view of a microelectronic device structure 300 (also referred to herein as structure 300) that is at least in part similar to the microelectronic device structure 100 of FIGS. 1 and 2, and where in the microelectronic device structure 300 of FIG. 3, two capacitor structures are integrated with corresponding plurality of contact pads of the microelectronic device structure 300, in accordance with an embodiment of the present disclosure.

Figure 3:
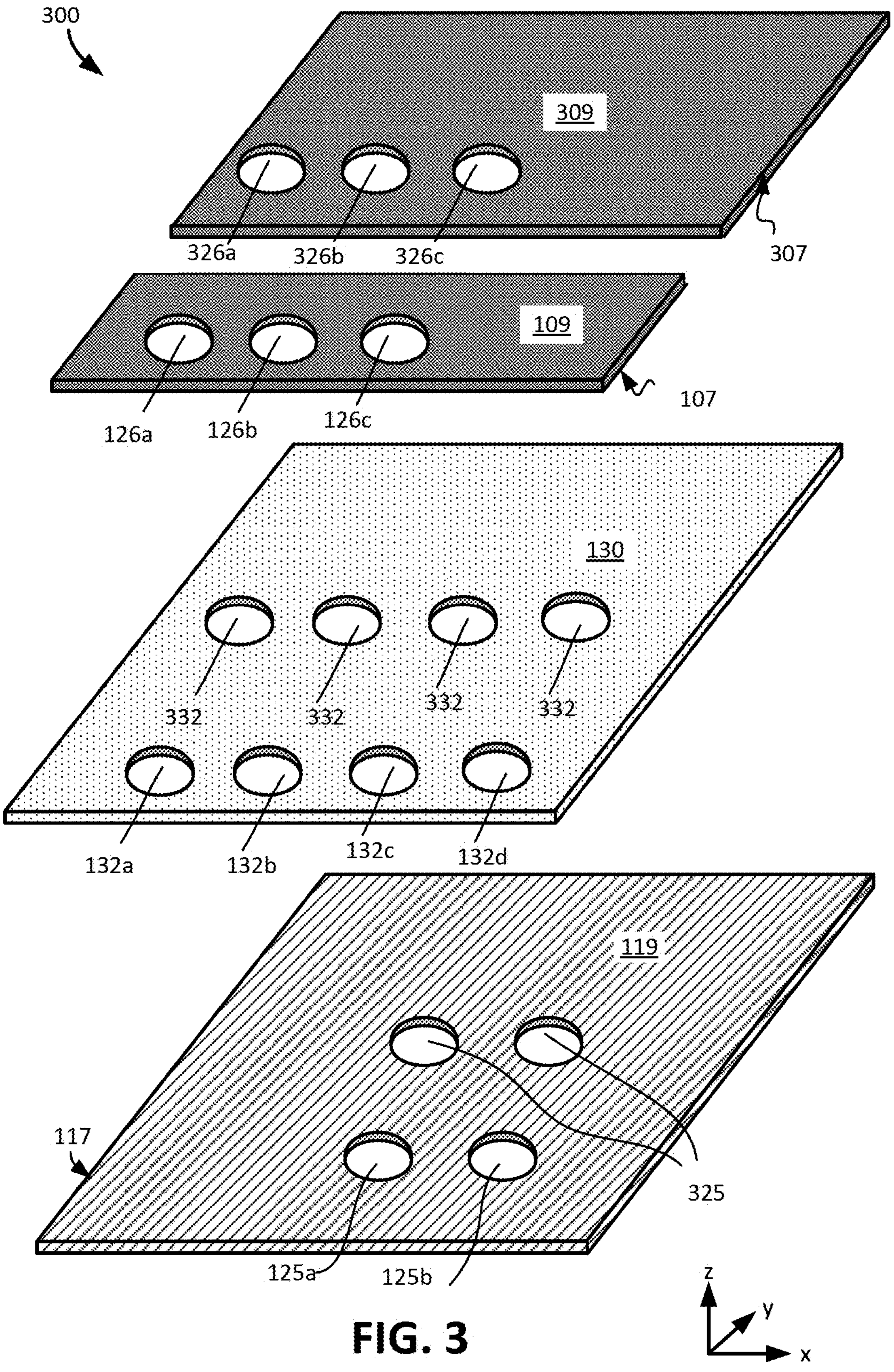
FIG. 3 illustrates an exploded perspective view of a microelectronic device structure that is at least in part similar to the microelectronic device structure of FIGS. 1 and 2, and in which two capacitor structures are integrated with corresponding plurality of contact pads of the microelectronic device structure, in accordance with an embodiment of the present disclosure.

For example, comparing the structure 300 of FIG. 3 with the structure 100 of FIGS. 1 and 2, in the structure 300, there are two laterally adjacent conductive layers 107 and 307. Thus, the single conductive layer 107 of FIGS. 1 and 2 are split into two conductive layers 107 and 307 in FIG. 3.

The conductive layer 107 has a horizontal section 109 and the conductive layer 307 has a horizontal section 309. Each of the conductive layers 107 and 307 have corresponding one or more vertical portions that are similar to the vertical portion 111 of FIGS. 1 and 2. However, such vertical portions of the layers 107 and 307, as well as the vertical layers 127*a*, are not illustrated in FIG. 3 for purposes of illustrative clarity.

Similar to FIGS. 1 and 2, the layer 107 in FIG. 3 has openings 126*a*, 126*b*, 126*c*. Also, similarly, the layer 307 in FIG. 3 has openings 326*a*, 326*b*, 326*c* through which vertical portions of the layer 117 and/or vertical layers 127 may extend. Also, similarly, the layer 117 in FIG. 3 has openings 125*a*, 125*b*, 325, as illustrated.

In an example, the layer 107 of FIGS. 1 and 2 is a power plane. In the example of FIG. 3, there may be two power planes 109 and 309, e.g., one of which may be for a first voltage level (e.g., 3.5 volts) and another of which may be for a second voltage level (e.g., 5 volts). Thus, one or more vertical components of the layer 107 of FIG. 3 may be coupled to interconnect components receiving the power at the first voltage level, and one or more vertical components of the layer 307 of FIG. 3 may be coupled to interconnect components receiving the power at the second voltage level. Both the power planes 109 and 309 may have a common ground plane 119.

In another example, instead of (or in addition to) splitting the layer 107 of FIGS. 1 and 2 into two disjoint layers 107 and 307 in FIG. 3, the layer 117 of FIGS. 1 and 2 may also be split into two disjoint. Similarly, instead of the planes 109 and 309 being power planes, the planes 109 and 309 may be ground planes. In an example, one of the planes 109 and 309 may be any one of a power plane, a ground plane, or a signal plane, and the other of the planes 109 and 309 may be another of the power plane, the ground plane, or the signal plane. FIG. 3 will be apparent, based on the description of FIGS. 1 and 2.

FIGS. 1-3 illustrate two levels of horizontal portions of the layers 107, 117, and 307. However, the structure described herein can also include multiple levels (e.g., more than two) of horizontal portions of the various conductive layers. For example, FIG. 4 illustrates a cross-sectional view of a microelectronic device structure 400 (also referred to herein as structure 400) that is at least in part similar to the microelectronic device structure 100 of FIGS. 1 and 2, wherein multiple capacitors integrated with contact pads are formed in the microelectronic device structure 400 of FIG. 4, in accordance with an embodiment of the present disclosure.

Figure 4:
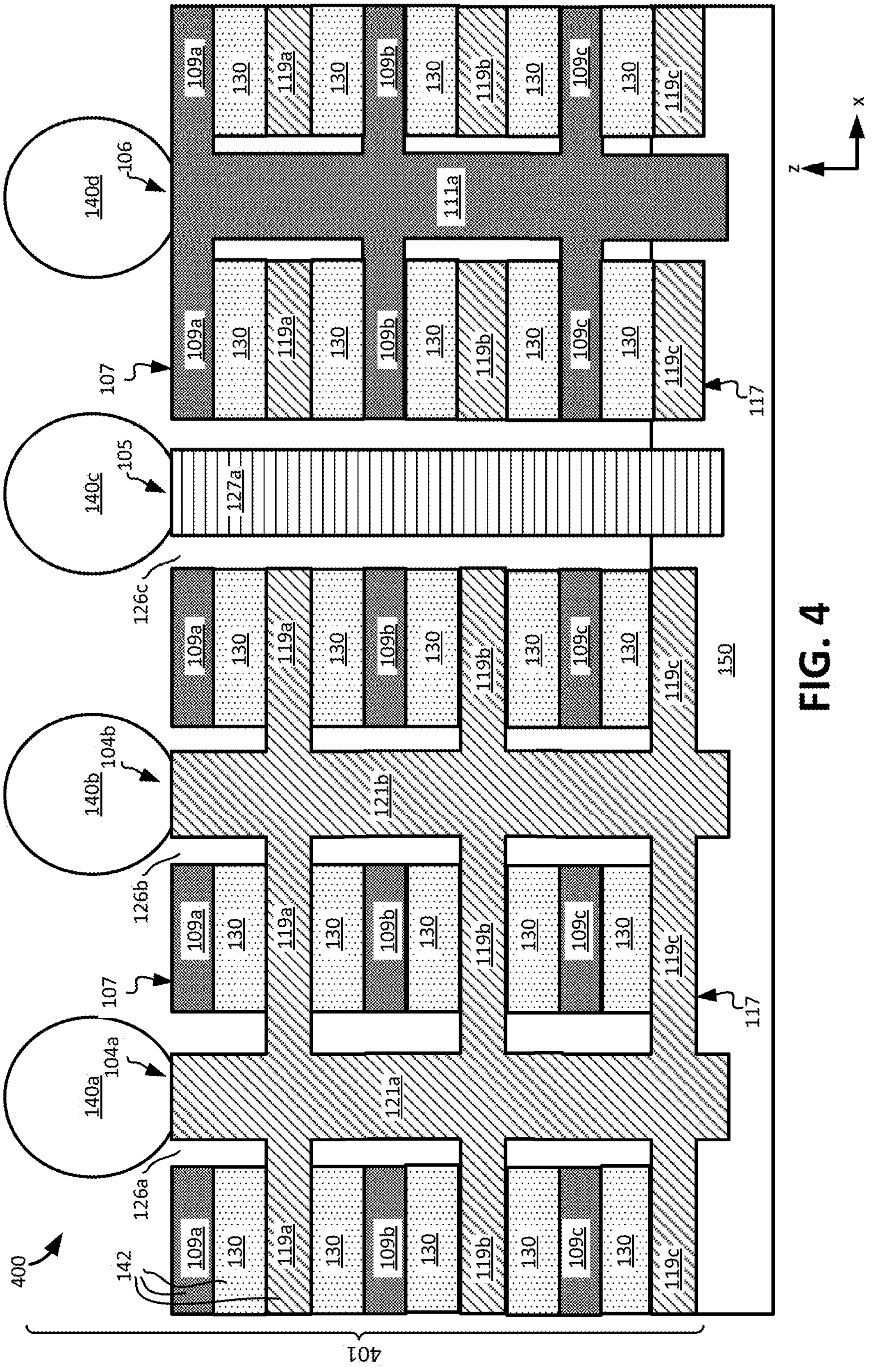
FIG. 4 illustrates a cross-sectional view of a microelectronic device structure that is at least in part similar to the microelectronic device structure of FIGS. 1 and 2, and in which multiple capacitors integrated with contact pads are formed, in accordance with an embodiment of the present disclosure.

For example, in FIG. 4, in an interconnect structure 401, the layer 107 has multiple horizontal portions 109*a*, 109*b*, 109*c*, where the horizontal portions 109*a*, 109*b*, 109*c* are along with vertically separated horizontal planes. For example, the horizontal portion 109*a* is along a first horizontal plane and the horizontal portion 109*b* is along a second horizontal plane, wherein the first and second horizontal planes are vertically separated, as illustrated in FIG. 4. The vertical portion 111*a* extends through the various horizontal portions 109*a*, 109*b*, 109*c*, and electrically and physically couples the various horizontal portions 109*a*, 109*b*, 109*c*. Although three various horizontal portions 109*a*, 109*b*, 109*c* are illustrated in FIG. 4, the layer 107 may include one (e.g., see FIGS. 1 and 2), two, four, or a higher number of such various horizontal portions. As also described with respect to FIGS. 1 and 2, in FIG. 4 the various horizontal portions 109*a*, 109*b*, 109*c* have openings therewithin, e.g., through which the layer 127*a* and the vertical components 1211 and 121*b* extend (the openings are not specifically labelled in FIG. 4).

Similarly, for example, in FIG. 4, in the interconnect structure 401, the layer 117 has multiple horizontal portions 119*a*, 119*b*, 119*c*, where the horizontal portions 119*a*, 119*b*, 119*c* are along with vertically separated horizontal planes. For example, the horizontal portion 119*a* is along a first horizontal plane and the horizontal portion 119*b* is along a second horizontal plane, wherein the first and second horizontal planes are vertically separated, as illustrated in FIG. 4. The vertical portion 121*a* and 121*b* extend through the various horizontal portions 119*a*, 119*b*, 119*c*, and electrically and physically couple the various horizontal portions 119*a*, 119*b*, 119*c*. Although three various horizontal portions 119*a*, 119*b*, 119*c* are illustrated in FIG. 4, the layer 117 may include one (e.g., see FIGS. 1 and 2), two, four, or a higher number of such various horizontal portions. As also described with respect to FIGS. 1 and 2, in FIG. 4 the various horizontal portions 119*a*, 119*b*, 119*c* have openings, e.g., through which the layer 127*a* and the vertical component 111*a* extend (the openings are not specifically labelled in FIG. 4).

Thus, a first capacitor may be formed between horizontal portions 109*a* and 119*a*, separated by a corresponding layer of dielectric material 130. Similarly, a second capacitor may be formed between horizontal portions 119*a* and 109*b*, separated by a corresponding layer of dielectric material 130, and so on. Thus, depending on a number of layers, more than one capacitor may be formed in the structure 400.

Referring to FIGS. 1-4, in an example, a capacitance of the capacitor(s) formed within the structures 100-400 may be based on an area of the horizontal portions of the layers 107, 117, a thickness of the intervening layer(s) of dielectric material 130, and/or a dielectric constant of the intervening layer(s) of dielectric material 130. In FIG. 2, the various horizontal portions 109, 119 of the layers 107, 117, respectively, are illustrated to have a square or rectangular shape, however, the horizontal portions 109, 119 may have any other appropriate shape, which may be controlled to tune the capacitance of the capacitor. In another example, one or both of the horizontal portions 109, 119 may be split in sections, as illustrated in FIG. 3, to tune the capacitance. Also, the vertical thickness of the dielectric material 130 and/or the selection of the dielectric material may be tuned, to achieve a desired dielectric constant of the dielectric material 130, and to thereby tune the capacitance.

Figure 5A:
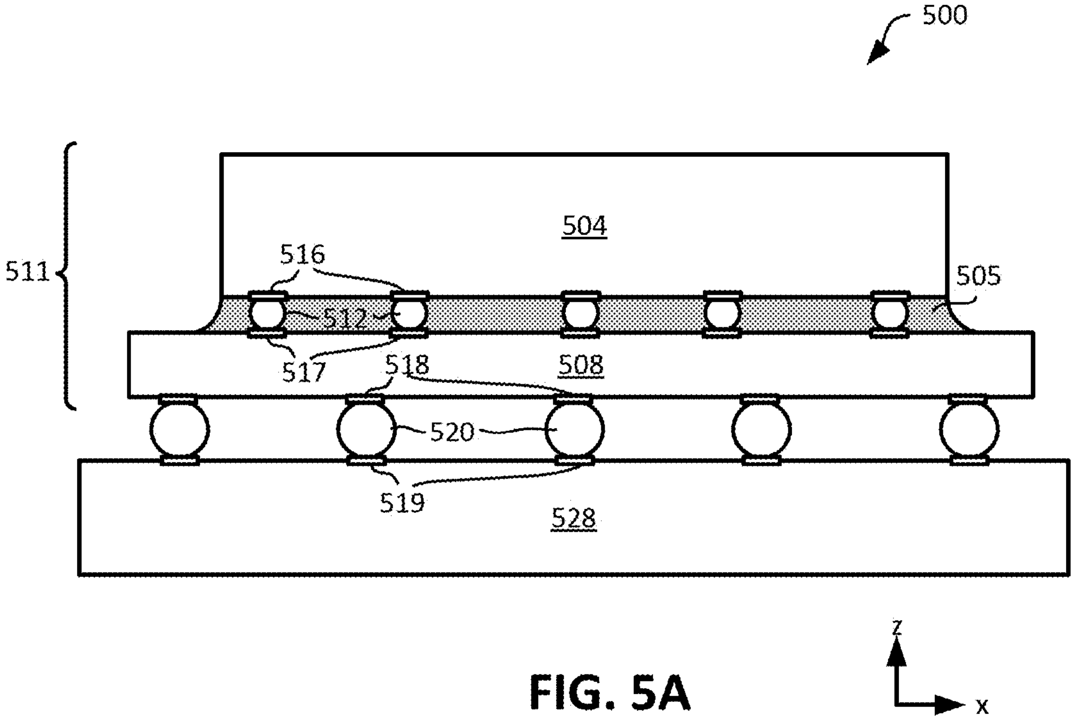
FIG. 5A illustrates a cross-sectional view of a flip-chip integrated circuit system including one or more capacitors integrated with contact pads, according to an embodiment of the present disclosure.

FIG. 5A illustrates a cross-sectional view of a flip-chip integrated circuit system 500 including one or more of the capacitors integrated with contact pads, as described above with respect to FIGS. 1-4, according to an embodiment of the present disclosure. The integrated circuit system 500 comprises a flip-chip integrated circuit package 511, in which an integrated circuit chip or die 504 is arranged in a flip chip configuration (e.g., mounted face-down) on an upper surface of a carrier substrate 508 of the integrated circuit package 511. As illustrated, the die 504 is coupled to the carrier substrate 508 through a plurality of interconnect components 512 (one or more of which may be similar to the interconnect components 140*a*, . . . , 140*d* of FIGS. 1-4). In an example, the interconnect components 512 are conductive bumps, such as solder bumps. For example, the solder bumps 512 are arranged in an array or a peripheral bump layout. An underfill material 505 is between the die 504 and the carrier substrate 508.

As illustrated, each of the interconnect components 512 is coupled to the die 504 through a corresponding contact pad 516, and is coupled to the carrier substrate 508 through a corresponding contact pad 517. Thus, there are a plurality of contact pads 516 coupled to the die 504, and another plurality of contact pads 517 coupled to the carrier substrate 508.

In one embodiment, at least some of the contact pads 516 are integrated with one or more capacitors described above with respect to FIGS. 1-4. For example, at least some of the contact pads 516 correspond to the contact pads 104*a*, 104*b*, and/or 106 of FIGS. 1-4. Thus, in such an example, the capacitors described above may be formed at a die level, e.g., within the die 504 mounted in a flip-chip configuration.

Similarly, in one embodiment, at least some of the pads 517 are integrated with one or more capacitors described above with respect to FIGS. 1-4. For example, at least some of the contact pads 517 correspond to the contact pads 104*a*, 104*b*, and/or 106 of FIGS. 1-4. Thus, in such an example, the capacitors described above may be formed at a package level, e.g., within a section of the carrier substrate 508 facing the die 504.

As illustrated in FIG. 5A, the carrier substrate 508 is coupled to a PCB or PWB 528, through a plurality of interconnect components 520 (one or more of which may be similar to the interconnect components 140*a*, . . . , 140*d* of FIG. 104). In an example, the interconnect components 520 are conductive balls, such as solder balls. For example, the carrier substrate 508 is coupled to the PCB 528 through the interconnect components 520, e.g., in a ball grid array (BGA) configuration, and/or another appropriate configuration to couple a carrier substrate to a PCB. In an example, the PCB may be a circuit card assembly (CCA). As illustrated, each interconnect component 520 is coupled to the carrier substrate 508 through a corresponding pad 518 on the carrier substrate 508, and is coupled to the PCB 528 through a corresponding pad 519 on the PCB 528. Thus, there are a plurality of pads 518 coupled to the carrier substrate 508, and another plurality of pads 519 coupled to the PCB 528.

In one embodiment, at least some of the contact pads 518 are integrated with one or more capacitors described above with respect to FIGS. 1-4. For example, at least some of the contact pads 518 correspond to the contact pads 104*a*, 104*b*, and/or 106 of FIGS. 1-4. Thus, in such an example, the capacitors described above may be formed at the package level, e.g., within a section of the carrier substrate 508 facing the PCB 528.

Similarly, in one embodiment, at least some of the pads 519 are integrated with one or more capacitors described above with respect to FIGS. 1-4. For example, at least some of the contact pads 519 correspond to the contact pads 104*a*, 104*b*, and/or 106 of FIGS. 1-4. Thus, in such an example, the capacitors described above may be formed at a board level, e.g., within a section of the PCB 528.

Thus, in an example, the device 150 of FIGS. 1-4 may be any of the die 504, the carrier substrate 508, and/or the PCB 528, and the above described capacitor(s) may be formed to be integrated with any of the pads 516, 517, 518, 519 of any of the die 504, the carrier substrate 508, and/or the PCB 528. Thus, the integrated capacitors described above can be applied (i) at die level, (ii) at IC package level, and/or (iii) at the circuit board level.

Figure 5B:
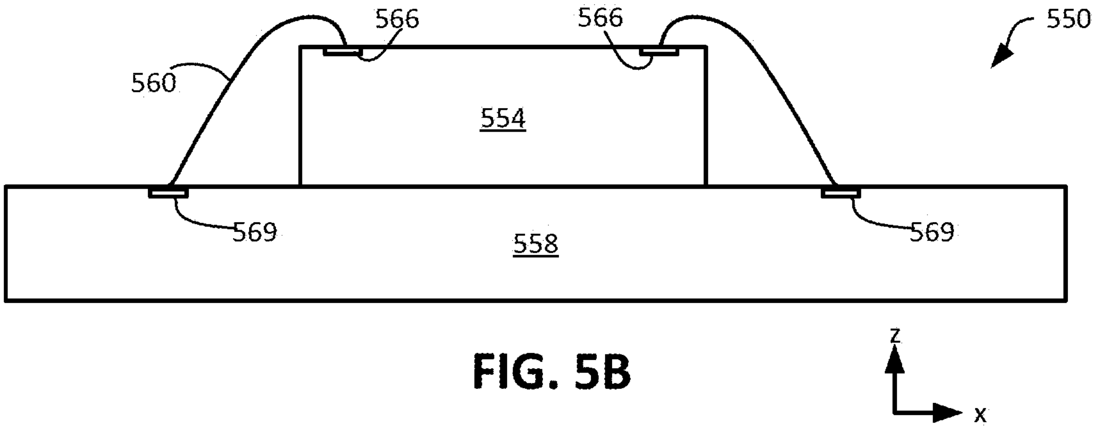
FIG. 5B illustrates a cross-sectional view of a wire bonded integrated circuit system including one or more capacitors integrated with contact pads, according to an embodiment of the present disclosure.

FIG. 5B illustrates a cross-sectional view of a wire bonded integrated circuit system 550 including one or more of the capacitors integrated with contact pads, as described above with respect to FIGS. 1-4, according to an embodiment of the present disclosure.

The integrated circuit system 550 comprises a wire bonded integrated circuit package, in which an integrated circuit chip or die 554 is arranged in a wire bonded configuration on a carrier substrate 558. As illustrated, the die 554 is coupled to the carrier substrate 558 through a plurality of conductive wires 560. In an example, each wire 560 is coupled to the die 554 through a corresponding contact pad structure 566, and to the carrier substrate 558 through a corresponding contact pad structure 569. Thus, there are a plurality of contact pad structures 566 coupled to the die 554, and another plurality of contact pad structures 569 coupled to the carrier substrate 558, in an example.

In one embodiment, at least some of the contact pad structures 566 are similar to the contact pad structures described above with respect to FIGS. 1-4, such that one or more capacitors may be integrated with the contact pad structures 566. Similarly, in one embodiment, at least some of the contact pad structures 569 are similar to the contact pad structures described above with respect to FIGS. 1-4, such that one or more capacitors may be integrated with the contact pad structures 569.

Figure 6:
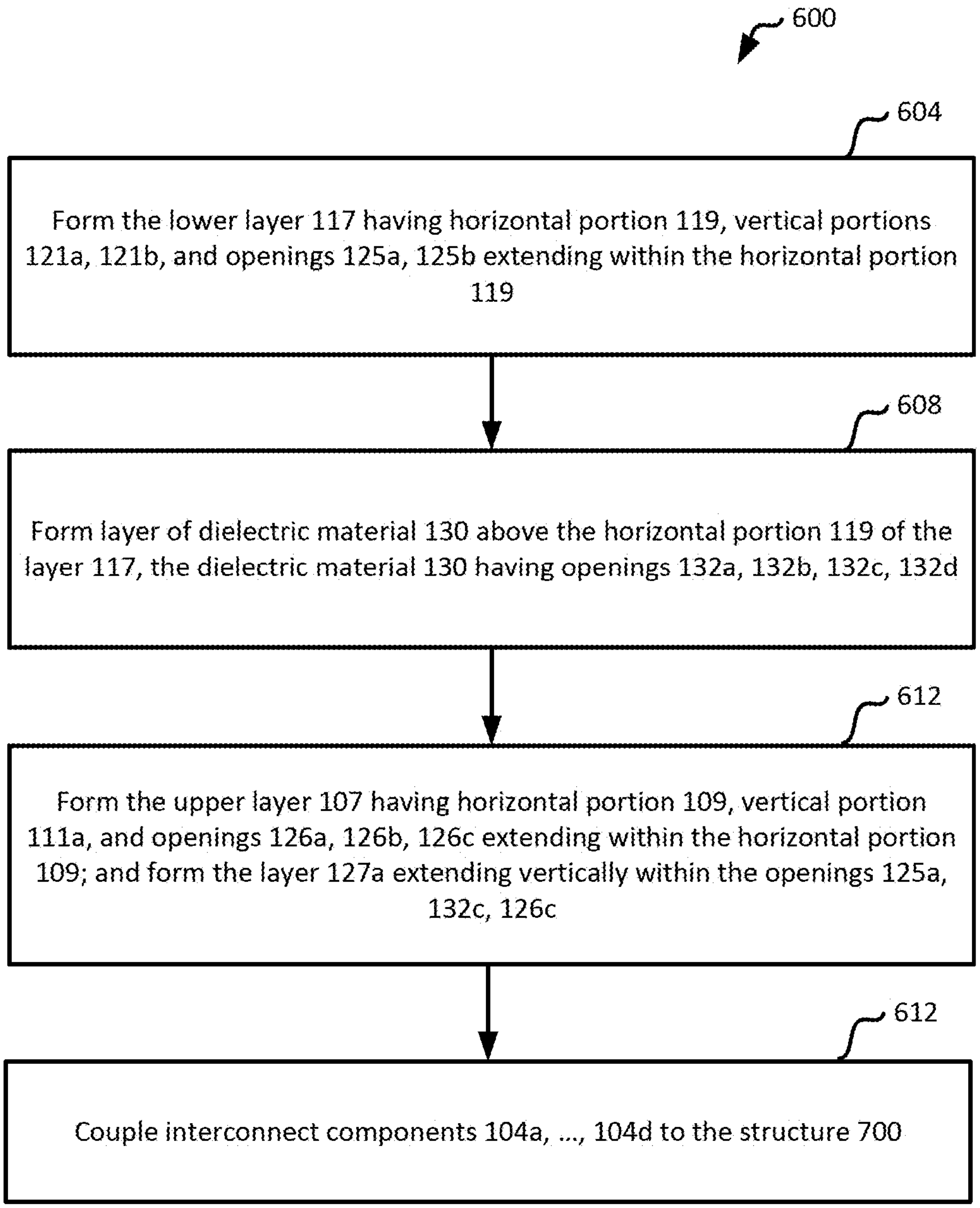
FIG. 6 illustrates a flowchart depicting a method of forming integrated capacitors, in accordance with an embodiment of the present disclosure.

FIG. 6 illustrate a flowchart depicting a method 600 of forming example integrated capacitor(s) of FIGS. 1-5, in accordance with an embodiment of the present disclosure. FIGS. 7A, 7B, 7C, and 7D collectively illustrate an example microelectronic device structure 700 in various stages of processing in accordance with the methodology 600 of FIG. 6, in accordance with an embodiment of the present disclosure. FIGS. 6 and 7A-7D will be discussed in unison.

Figure 7A:
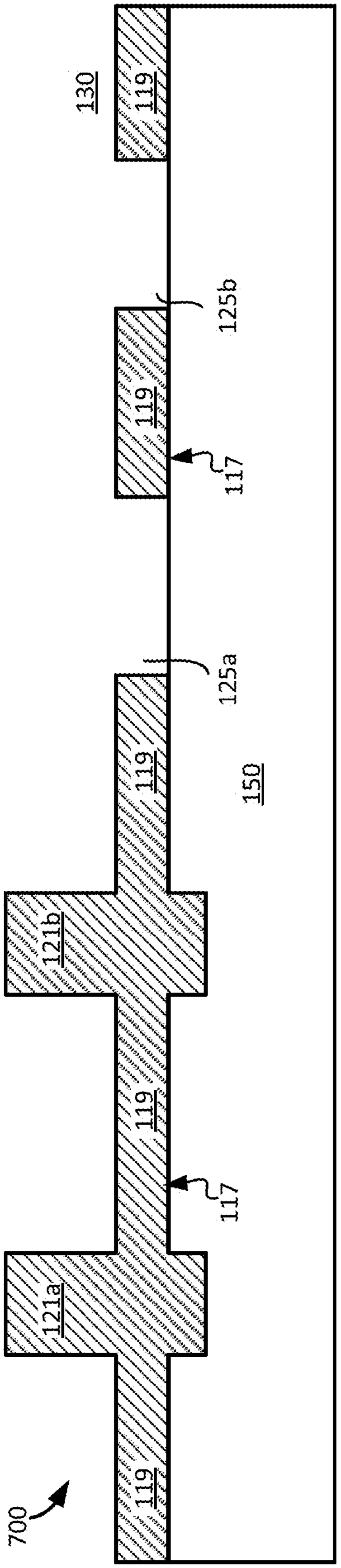
FIGS. 7A, 7B, 7C, and 7D collectively illustrate an example microelectronic device structure in various stages of processing in accordance with the methodology of FIG. 6, in accordance with an embodiment of the present disclosure.

Referring to FIG. 6, the method 600 comprises, at 604, forming a lower layer 117 of conductive material having horizontal portion 119, vertical portions 121*a*, 121*b*, and openings 125*a*, 125*b* extending within the horizontal portion 119, e.g., as illustrated in FIG. 7A and as described above with respect to FIGS. 1 and 2. The layer 117 may be formed using appropriate techniques for forming such a layer. For example, the layer 117 may be formed by additively depositing conductive material on the device 150 through one or more appropriate masks. In another example, the layer 117 may be formed by a subtractive process, e.g., where the openings 125*a*, 125*b* are formed within the layer 117, e.g., after formation of the horizontal and vertical portions of the layer 117. In an example, the horizontal portion 119, vertical portions 121*a*, 121*b* may be monolithic (a continuous body of conductive material, without an interface therebetween).

Figure 7B:
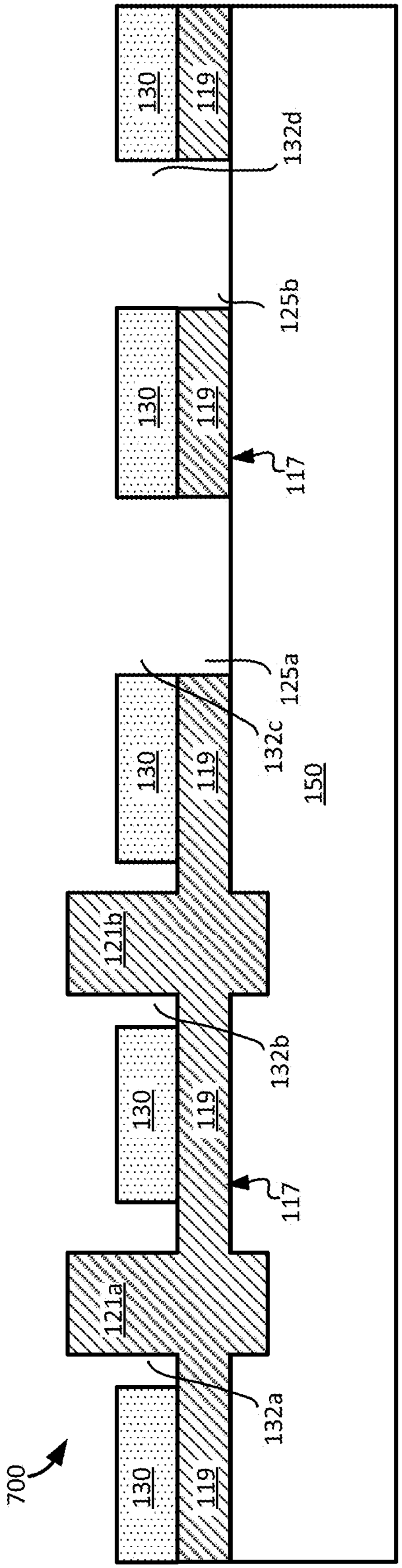

The method 600 proceeds from 604 to 608, where a layer of dielectric material 130 is formed above the horizontal portion 119 of the layer 117, where the dielectric material 130 has openings 132*a*, 132*b*, 132*c*, 132*d*, e.g., as illustrated in FIG. 7B and as described above. In an example, the dielectric material 130 may be deposited using an appropriate deposition technique, such as sputtering, chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example.

Figure 7C:
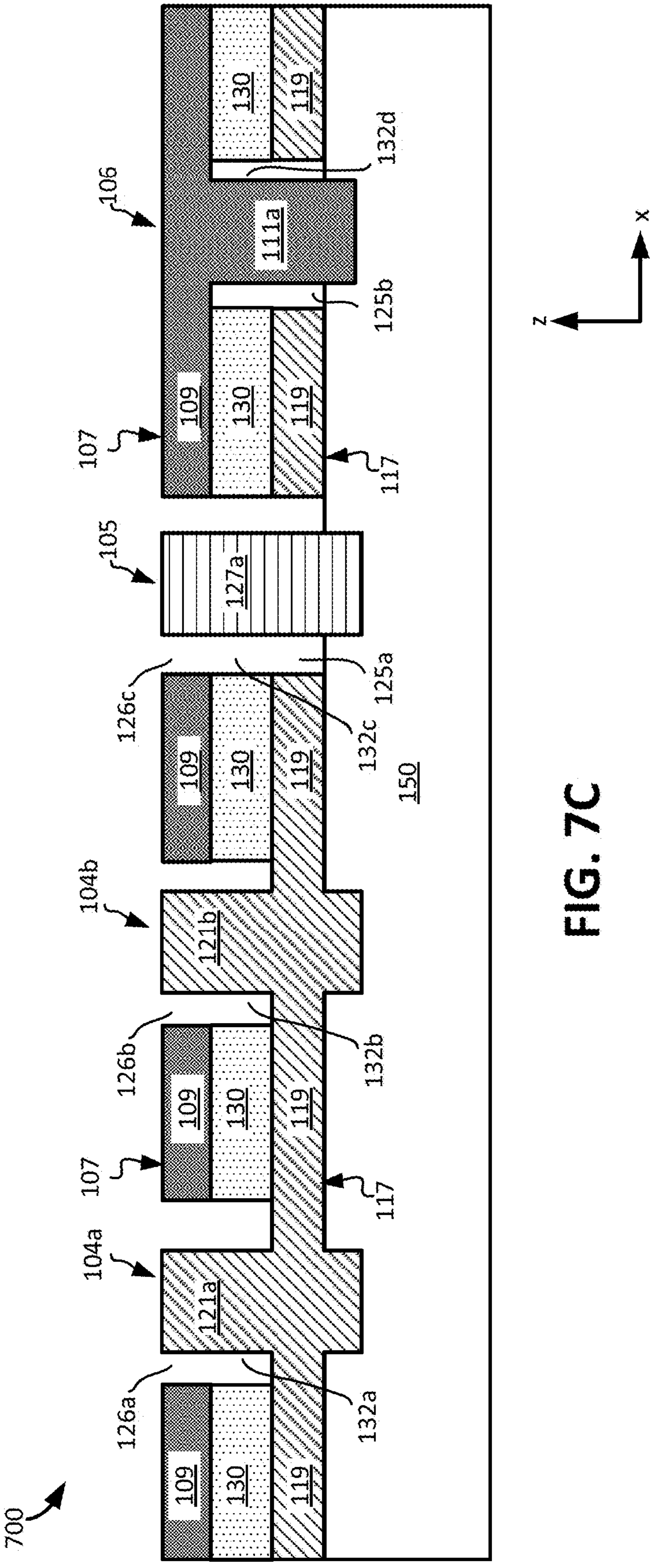

The method 600 proceeds from 608 to 612, where the upper layer 107 is formed, where the layer 107 comprises horizontal portion 109, vertical portion 111*a*, and openings 126*a*, 126*b*, 126*c* extending within the horizontal portion 109, as illustrated in FIG. 7C and as also described above. Also, at 612, the layer 127*a* extending vertically within the openings 125*a*, 132*c*, 126*c* is also formed. In an example, the layers 107 and/or 127*a* may be formed using techniques described above with respect to process 604.

Figure 7D:
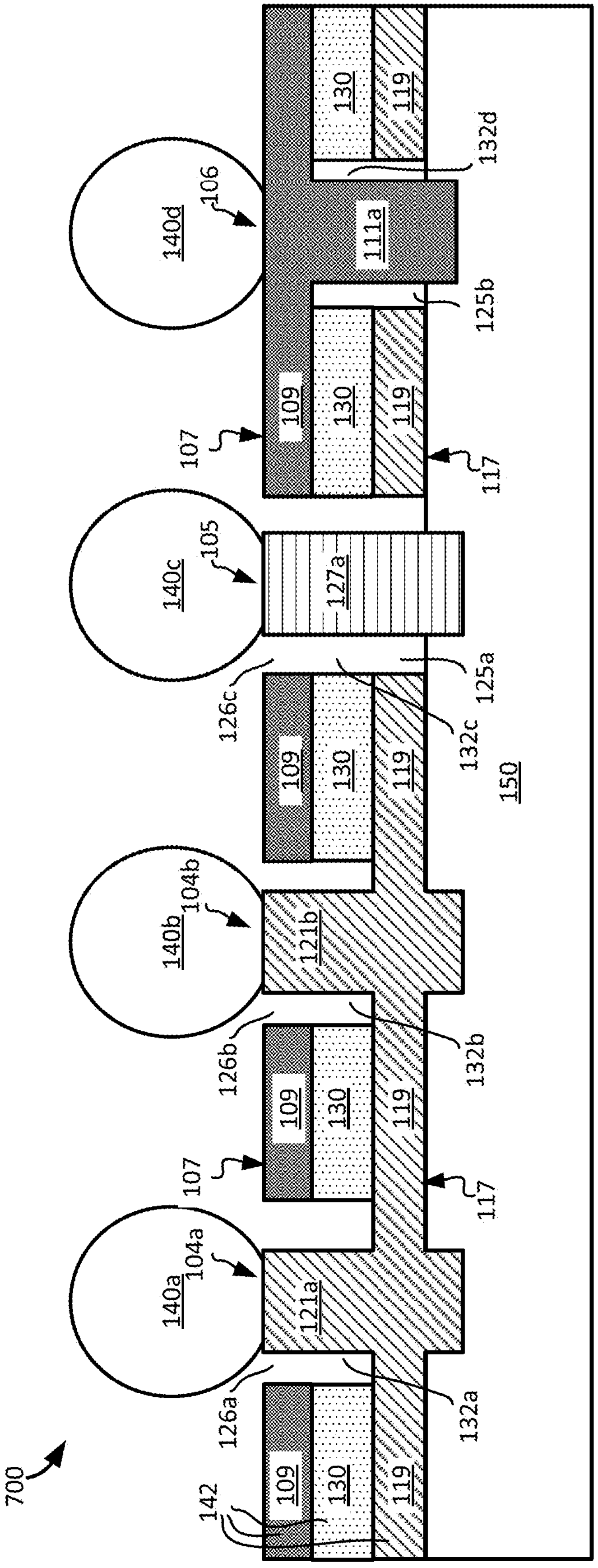

The method 600 proceeds from 612 to 616, where the interconnect components 104*a*, 104*b*, 104*c*, 104*d* are coupled (e.g., soldered, or otherwise coupled) to the structure 700 as illustrated in FIG. 7D and as also described above. The structure 700 of FIG. 7D is similar to the structure 100 of FIGS. 1 and 2.

Note that the processes in method 600 are shown in a particular order for ease of description. However, one or more of the processes may be performed in a different order or may not be performed at all (and thus be optional), in accordance with some embodiments. Numerous variations on method 600 and the techniques described herein will be apparent in light of this disclosure.

Further Example Embodiments

The following examples pertain to further embodiments, from which numerous permutations and configurations will be apparent.

Example 1. An interconnect structure comprising: a first layer of conductive material comprising (i) a first horizontal portion extending along a first horizontal plane, with a first opening within the first horizontal portion, and (ii) a first vertical portion; a second layer of conductive material comprising (i) a second horizontal portion extending along a second horizontal plane, with a second opening within the second horizontal portion, and (ii) a second vertical portion; and a layer of dielectric material extending along a third horizontal plane between the first and second horizontal portions, and having third and fourth openings; wherein the first vertical component extends upward from the first horizontal portion, through the third opening within the layer of dielectric material and through the second opening within the second horizontal portion; and wherein the second vertical component extends downward from the second horizontal portion, through the fourth opening within the layer of dielectric material and through the first opening within the first horizontal portion.

Example 2. The interconnect structure of example 1, wherein: at least a section of the first horizontal portion provides a first capacitor electrode, at least a section of the second horizontal portion provides a second capacitor electrode, and at least a section of the layer of dielectric material provides a capacitor dielectric; and the first capacitor electrode, the second capacitor electrode, and the capacitor dielectric provide a capacitor.

Example 3. The interconnect structure of any one of examples 1-2, further comprising: a first interconnect component coupled to an upper surface of the first vertical portion; and a second interconnect component coupled to an upper surface of the second horizontal portion.

Example 4. The interconnect structure of any one of examples 1-3, wherein: the first horizontal portion has a fifth opening therewithin; the second horizontal portion has a sixth opening therewithin; the layer of dielectric material has a seventh opening therewithin; a third layer of conductive material extending vertically through the fifth, sixth, and seventh openings.

Example 5. The interconnect structure of example 4, further comprising: a first interconnect component coupled to an upper surface of the first vertical portion; a second interconnect component coupled to an upper surface of the second horizontal portion; and a third interconnect component coupled to an upper surface of the third layer.

Example 6. The interconnect structure of example 5, wherein each of the first, second, and third interconnect components is a solder ball or a solder bump.

Example 7. The interconnect structure of any one of examples 1-6, wherein: the first layer is coupled to one of a power terminal, a ground terminal, or a signal terminal; and the second layer is coupled to another of the power terminal, the ground terminal, or signal terminal.

Example 8. The interconnect structure of any one of examples 1-7, wherein the first layer further comprises a third vertical portion that extends upward from the first horizontal portion, through a fifth opening within the layer of dielectric material and through a sixth opening within the second horizontal portion.

Example 9. The interconnect structure of any one of examples 1-8, wherein the second layer further comprises a third vertical portion that extends downward from the second horizontal portion, through a fifth opening within the layer of dielectric material and through a sixth opening within the first horizontal portion.

Example 10. The interconnect structure of any one of examples 1-9, wherein one or both of: the first layer is monolithic, such that there is no interface between the first horizontal portion and the first vertical portion; or the second layer is monolithic, such that there is no interface between the second horizontal portion and the second vertical portion.

Example 11. The interconnect structure of any one of examples 1-10, wherein: the first layer of conductive material comprises a third horizontal portion extending along a fourth horizontal plane that is different from the first, second, and third horizontal planes, with a fifth opening within the third horizontal portion; the second layer of conductive material comprises a fourth horizontal portion extending along a fifth horizontal plane that is different from the first, second, third, and fourth horizontal planes, with a sixth opening within the fourth horizontal portion; and the interconnect structure further comprises another layer of dielectric material extending along a sixth horizontal plane between the third and fourth horizontal portions.

Example 12. The interconnect structure of any one of examples 1-11, wherein the conductive material of the first layer is elementally different from the conductive material of the second layer.

Example 13. The interconnect structure of any one of examples 1-12, wherein the conductive material of the first layer is the same as the conductive material of the second layer.

Example 14. The interconnect structure of any one of examples 1-13, wherein the interconnect structure is included within one of a circuit board, an integrated circuit die, or a carrier substrate of an integrated circuit package.

Example 14a. A printed circuit board (PCB) or printed wiring board (PWB) including the interconnect structure of any one of examples 1-14.

Example 14b. A printed circuit board (PCB) including the interconnect structure of any one of examples 1-14.

Example 14c. A printed wiring board (PWB) including the interconnect structure of any one of examples 1-14.

Example 14d. A circuit card assembly (CCA) including the interconnect structure of any one of examples 1-14.

Example 14e. An integrated circuit including the interconnect structure of any one of examples 1-14.

Example 15. An apparatus comprising: a first contact pad structure comprising conductive material, and a first horizontal portion of conductive material extending from the first contact pad structure along a first horizontal plane; a second contact pad structure comprising conductive material, and a second horizontal portion of conductive material extending from the second contact pad structure along a second horizontal plane different from the first horizontal plane; and a layer of dielectric material between the first horizontal plane and the second first horizontal plane, the layer of dielectric material having a thickness of at most 4000 nanometers (nm).

Example 16. The apparatus of example 15, wherein: at least a section of the first horizontal portion provides a first capacitor electrode, at least a section of the second horizontal portion provides a second capacitor electrode, and at least a section of the layer of dielectric material provides a capacitor dielectric; and the first capacitor electrode, the second capacitor electrode, and the capacitor dielectric provide a capacitor.

Example 17. The apparatus of any one of examples 15-16, wherein: the first contact pad structure comprises a vertical structure that extends through an opening within the second horizontal portion, without making contact with the second horizontal portion.

Example 18. The apparatus of any one of examples 15-17, wherein: the second contact pad structure comprises a vertical structure that extends through an opening within the first horizontal portion, without making contact with the first horizontal portion.

Example 19. A capacitor structure comprising: a first electrode, continuous and monolithic with, a first contact pad; a second electrode, continuous and monolithic with, a second contact pad; and a capacitor dielectric between the first electrode and the second electrode.

Example 20. The capacitor structure of example 19, wherein: the first contact pad comprises a vertical structure that extends through an opening within the second electrode, without making contact with the second electrode.

Example 21. A printed circuit board (PCB) or printed wiring board (PWB) including the capacitor structure of example 20.

Example 22. A printed circuit board (PCB) including the capacitor structure of example 20.

Example 23. A printed wiring board (PWB) including the capacitor structure of example 20.

Example 24. A circuit card assembly (CCA) including the capacitor structure of example 20.

Example 25. An integrated circuit including the capacitor structure of example 20.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An interconnect structure comprising:

a first layer of conductive material comprising (i) a first horizontal portion extending along a first horizontal plane, with a first opening within the first horizontal portion, and (ii) a first vertical portion;

a second layer of conductive material comprising (i) a second horizontal portion extending along a second horizontal plane, with a second opening within the second horizontal portion, and (ii) a second vertical portion; and a layer of dielectric material extending along a third horizontal plane between the first and second horizontal portions, and having third and fourth openings;

wherein the first vertical portion extends upward from the first horizontal portion, through the third opening within the layer of dielectric material and through the second opening within the second horizontal portion; and wherein the second vertical portion extends downward from the second horizontal portion, through the fourth opening within the layer of dielectric material and through the first opening within the first horizontal portion;

wherein one or both of:

the first layer is monolithic, such that there is no interface between the first horizontal portion and the first vertical portion; or the second layer is monolithic, such that there is no interface between the second horizontal portion and the second vertical portion;

wherein the interconnect structure is included within an integrated circuit die and formed to be integrated with contact pads of the integrated circuit die.

2. The interconnect structure of claim 1, wherein:

at least a section of the first horizontal portion provides a first capacitor electrode, at least a section of the second horizontal portion provides a second capacitor electrode, and at least a section of the layer of dielectric material provides a capacitor dielectric; and the first capacitor electrode, the second capacitor electrode, and the capacitor dielectric provide a capacitor.

3. The interconnect structure of claim 1, further comprising:

a first interconnect component coupled to an upper surface of the first vertical portion; and a second interconnect component coupled to an upper surface of the second horizontal portion.

4. The interconnect structure of claim 1, wherein:

the first horizontal portion has a fifth opening therewithin;

the second horizontal portion has a sixth opening therewithin;

the layer of dielectric material has a seventh opening therewithin;

a third layer of conductive material extending vertically through the fifth, sixth, and seventh openings.

5. The interconnect structure of claim 4, further comprising:

a first interconnect component coupled to an upper surface of the first vertical portion;

a second interconnect component coupled to an upper surface of the second horizontal portion; and a third interconnect component coupled to an upper surface of the third layer.

6. The interconnect structure of claim 5, wherein each of the first, second, and third interconnect components is a solder ball or a solder bump.

7. The interconnect structure of claim 1, wherein:

the first layer is coupled to one of a power terminal, a ground terminal, or a signal terminal; and the second layer is coupled to another of the power terminal, the ground terminal, or signal terminal.

8. The interconnect structure of claim 1, wherein the first layer further comprises a third vertical portion that extends upward from the first horizontal portion, through a fifth opening within the layer of dielectric material and through a sixth opening within the second horizontal portion.

9. The interconnect structure of claim 1, wherein the second layer further comprises a third vertical portion that extends downward from the second horizontal portion, through a fifth opening within the layer of dielectric material and through a sixth opening within the first horizontal portion.

10. The interconnect structure of claim 1, wherein:

the first layer of conductive material comprises a third horizontal portion extending along a fourth horizontal plane that is different from the first, second, and third horizontal planes, with a fifth opening within the third horizontal portion;

the second layer of conductive material comprises a fourth horizontal portion extending along a fifth horizontal plane that is different from the first, second, third, and fourth horizontal planes, with a sixth opening within the fourth horizontal portion; and the interconnect structure further comprises another layer of dielectric material extending along a sixth horizontal plane between the third and fourth horizontal portions.

11. The interconnect structure of claim 1, wherein the conductive material of the first layer is elementally different from the conductive material of the second layer.

12. The interconnect structure of claim 1, wherein the conductive material of the first layer is the same as the conductive material of the second layer.

13. The interconnect structure of claim 1, wherein the interconnect structure is included within an integrated circuit die.

14. An apparatus comprising:

a first contact pad structure comprising conductive material, and a first horizontal portion of conductive material extending from the first contact pad structure along a first horizontal plane, wherein at least a section of the first horizontal portion provides a first capacitor electrode that is continuous and monolithic with the first contact pad structure, such that there is no interface between the first capacitor electrode and the first contact pad structure;

a second contact pad structure comprising conductive material, and a second horizontal portion of conductive material extending from the second contact pad structure along a second horizontal plane different from the first horizontal plane, wherein at least a section of the second horizontal portion provides a second capacitor electrode that is continuous and monolithic with the second contact pad structure, such that there is no interface between the second capacitor electrode and the second contact pad structure; and a layer of dielectric material between the first horizontal plane and the second first horizontal plane, the layer of dielectric material having a thickness of at most 4000 nanometers (nm), wherein the apparatus is included within an integrated circuit die and formed to be integrated with contact pads of the integrated circuit die.

15. The apparatus of claim 14, wherein:

at least a section of the first horizontal portion provides a first capacitor electrode, at least a section of the second horizontal portion provides a second capacitor electrode, and at least a section of the layer of dielectric material provides a capacitor dielectric; and the first capacitor electrode, the second capacitor electrode, and the capacitor dielectric provide a capacitor.

16. The apparatus of claim 14, wherein:

the first contact pad structure comprises a vertical structure that extends through an opening within the second horizontal portion, without making contact with the second horizontal portion.

17. The apparatus of claim 14, wherein:

the second contact pad structure comprises a vertical structure that extends through an opening within the first horizontal portion, without making contact with the first horizontal portion.

18. A capacitor structure comprising:

a first electrode, continuous and monolithic with, a first contact pad;

a second electrode, continuous and monolithic with, a second contact pad;

a capacitor dielectric between the first electrode and the second electrode; and wherein the capacitor structure is included within an integrated circuit die and formed to be integrated with contact pads of the integrated circuit die.

19. The capacitor structure of claim 18, wherein:

the first contact pad comprises a vertical structure that extends through an opening within the second electrode, without making contact with the second electrode.

* * * * *